United States Patent [19]

Delagrange

[11] Patent Number: 5,237,526
[45] Date of Patent: Aug. 17, 1993

[54] HIGH SPEED ELECTRONIC ANALOG COMPUTERS USING LOW-GAIN AMPLIFIERS

[75] Inventor: Arthur D. Delagrange, Mt. Airy, Md.

[73] Assignee: The United States of America as represented by the Secretary of the Navy, Washington, D.C.

[21] Appl. No.: 751,479

[22] Filed: Aug. 29, 1991

[51] Int. Cl.$^5$ .......................... G06G 7/00; H03F 3/45
[52] U.S. Cl. ..................................... 364/807; 330/255
[58] Field of Search .................. 364/807; 330/69, 252, 330/255, 257

[56] References Cited

U.S. PATENT DOCUMENTS 3,660,774  5/1972  Eachus .................................. 330/69
5,004,986  4/1991  Bohrer ................................. 330/257

Primary Examiner—Long T. Nguyen
Attorney, Agent, or Firm—William C. Townsend; Edward J. Connors; Kenneth W. Dobyns

[57] ABSTRACT

The operational amplifiers conventionally used in electronic analog computers can be replaced with fixed-gain differential amplifiers having no external negative feedback to control their gain. This allows a large increase in the bandwidth of the computers, with a resulting faster response time. Circuits for summing, integration, and differentiations are specifically disclosed using fixed-gain amplifiers.

9 Claims, 4 Drawing Sheets

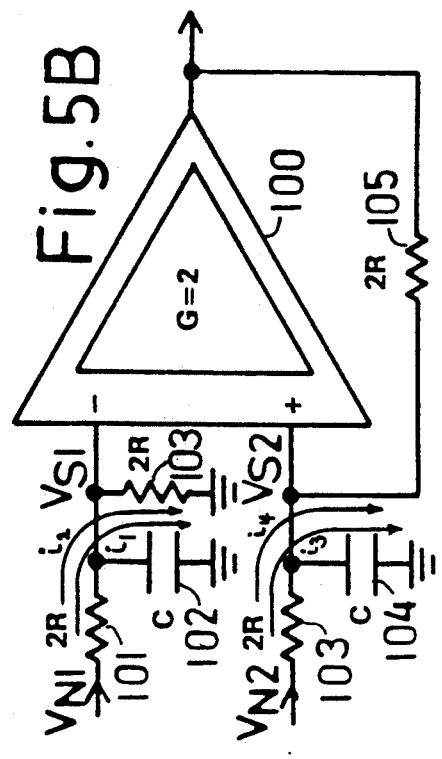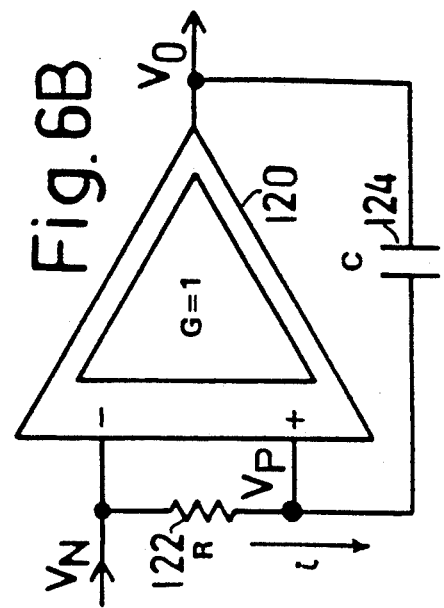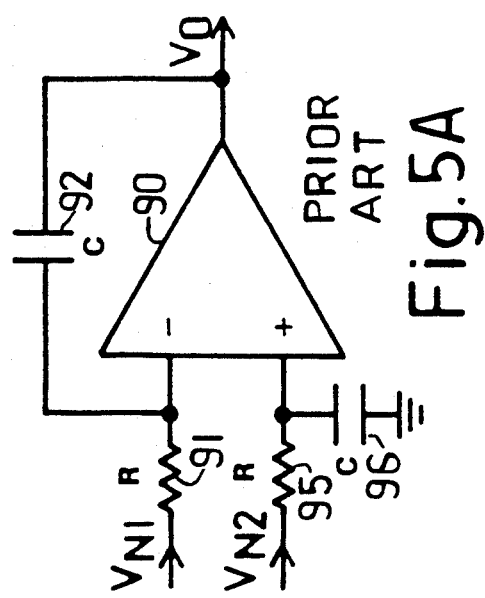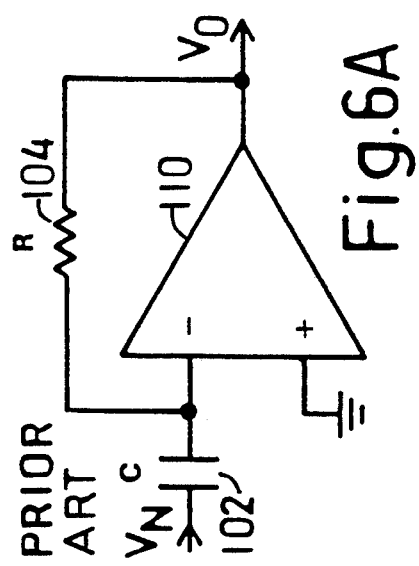

HIGH SPEED ELECTRONIC ANALOG COMPUTERS USING LOW-GAIN AMPLIFIERS

BACKGROUND OF THE INVENTION

1. Field of the Invention

This invention relates to the field of electronic analog computers.

2. Description of the Prior Art

Electronic analog circuits are most typically constructed using high-gain differential operational amplifiers. The theory is easily understood and integrated circuit operational amplifiers are readily available from a number of manufacturers. Unfortunately, operational amplifiers are extremely slow under operating conditions. The operating characteristics of operational amplifiers are typically rated by the product of gain and bandwidth, which, for the widely used 741 amplifier is given as about one million. Since a gain of from 100 to 1000 is needed to make operational amplifiers operate in computer circuits according to theory, the bandwidth is from 1 to 10 kHz. Some more modern operational amplifiers are capable of significantly better but still low bandwidths.

I have previously published a description of a system for building active filters without operational amplifiers in "Build Active Filters without Op Amps," EDN, published on Feb. 20, 1986, pages 246 and 248. In this article I discussed the use of fixed-gain amplifiers for use in active filters, but I did not arrive at that time at the use of fixed-gain amplifiers in analog computers.

SUMMARY OF THE INVENTION

I have discovered that the normal electronic analog computer operations which are traditionally done with high-gain operational amplifiers can be carried out using differential amplifiers having low but accurate gain. I have defined these as fixed-gain amplifiers (FGAs). They are operated without any external negative feedback since they are internally constructed to have the desired gain, and no external feedback to limit gain is necessary or desirable. Stated another way, the external negative feedback impedance has a very large value approaching infinity. I have never found an instance in which an amplifier gain of greater than six was necessary, and usually a gain of one or two is more appropriate. The bandwidth or speed of operation is much greater than with the more typical operational amplifier controlled by feedback.

BRIEF DESCRIPTION OF THE DRAWINGS

FIG. 5A is a diagram of a prior art differential integrator using an operational amplifier.

FIG. 5B is a diagram of an differential integrator using a fixed-gain amplifier in accordance with the present invention.

FIG. 6A is a diagram of a prior art inverting differentiator using an operational amplifier.

FIG. 6B is a diagram of a inverting differentiator using a fixed-gain amplifier in accordance with the present invention.

DESCRIPTION OF THE PREFERRED EMBODIMENTS

Figure 1A:
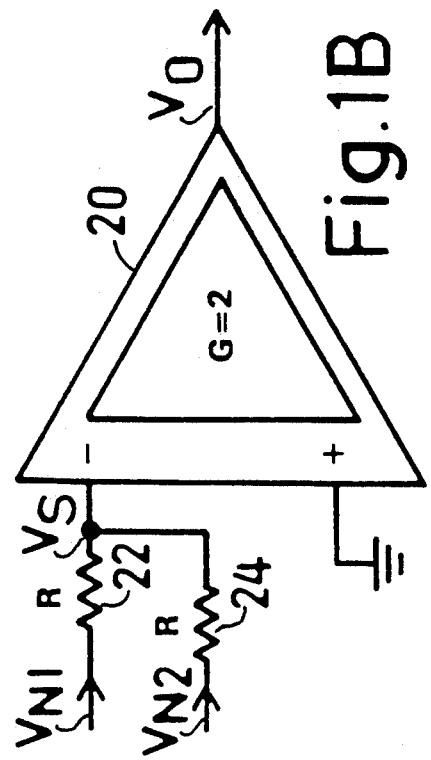
FIG. 1A is a diagram of a prior art inverting summer using an operational amplifier.

FIG. 1A is a conventional prior art inverting summer, in which an operational amplifier 10 is provided with two input lines to its inverting input through resistors 12 and 14, and is also provided with feedback from its output to its inverting input through a resistor 16, each resistor having a value R. As is obvious to anyone skilled in the analog computing art, $$V_O = -(R/R)(V_{N1} + V_{N2}), \text{ where } R/R = 1.$$

Thus, $V_O = -(V_{N1} + V_{N2})$.

Figure 1B:
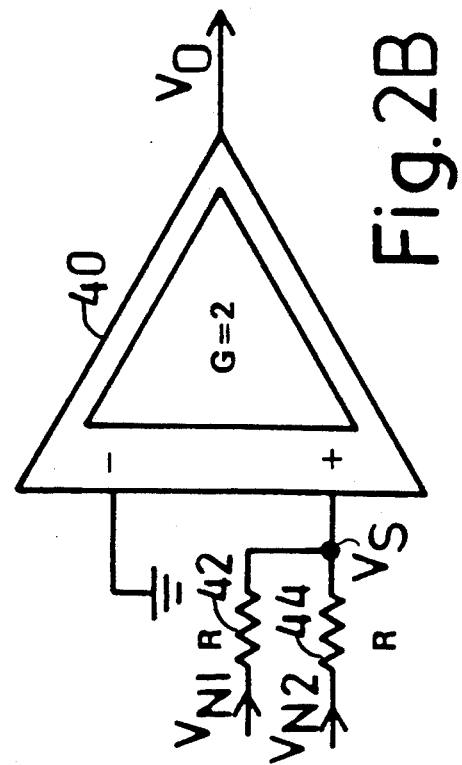
FIG. 1B is a diagram of an inverting summer using a fixed-gain amplifier in accordance with the present invention.

FIG. 1B is an inverting summer constructed according to the present invention. A fixed-gain amplifier 20 with a gain of 2 has its non-inverting input grounded and has two input lines connected to its inverting input through resistors 22 and 24, each resistor having a value R. Note that I have chosen a triangle within another triangle as the symbol for the fixed-gain differential amplifier. The gain being important in such amplifiers, it is ordinarily shown at the center of the symbol. The output voltage of the inverting summer of FIG. 1B is $$V_O = -G\frac{(RV_{N1} + RV_{N2})}{2R} \text{ where } G = 2,$$

or $V_O = -(V_{N1} + V_{N2})$.

Thus the same answer is obtained from the prior art operational amplifier inverting summer and from the fixed-gain amplifier inverting summer in accordance with the present invention. No external negative feedback is used in the device of FIG. 1B to accomplish this result.

Figure 2A:
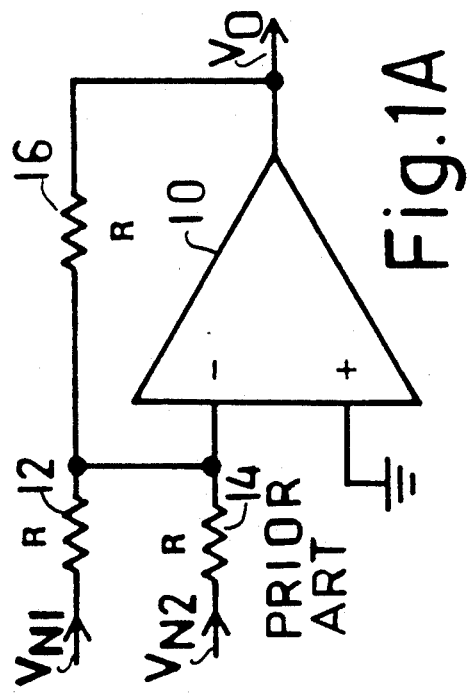
FIG. 2A is a diagram of a prior art non-inverting summer using an operational amplifier.

FIG. 2A is a prior art non-inverting summer in which an operational amplifier 30 is provided with a zero or ground input through a resistor 38 having a value R, connected to the inverting input, to which negative feedback from the $V_O$ voltage at the output terminal is also provided through a resistor 36 having a value R. The two input voltages $V_{N1}$ and $V_{N2}$ are respectively connected through resistors 32 and 34, each having a value R, to the non-inverting input of operational amplifier 30. It is obvious to those skilled in the analog computer art that the output from this prior art circuit is $V_O = +(V_{N1} + V_{N2})$.

Figure 2B:
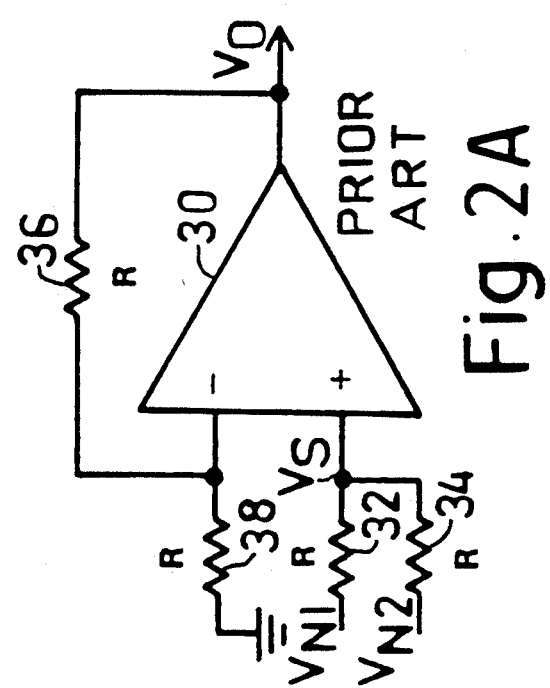
FIG. 2B is a diagram of a non-inverting summer using a fixed-gain amplifier in accordance with the present invention.

In FIG. 2B, a non-inverting summer in accordance with the present invention is illustrated. A fixed gain amplifier 40 with a gain of 2 has its inverting input grounded and has input voltages $V_{N1}$ and $V_{N2}$ connected to its non-inverting input respectively through input resistors 42 and 44, each having a value R. Together they act to form a voltage $V_S$ at the non-inverting input of amplifier 40. The output voltage $V_O$ from amplifier 40 is given by $V_O = +(V_{N1} 30\ V_{N2})$, which is seen to be the same as obtained from the conventional prior art circuit for the same purpose. No external negative feedback is used to accomplish this result.

Figure 3B:
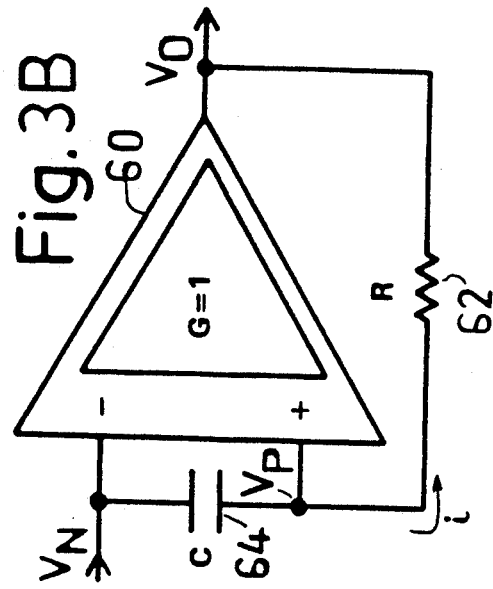
FIG. 3B is a diagram of an inverting integrator using a fixed-gain amplifier in accordance with the present invention.
Figure 3A:
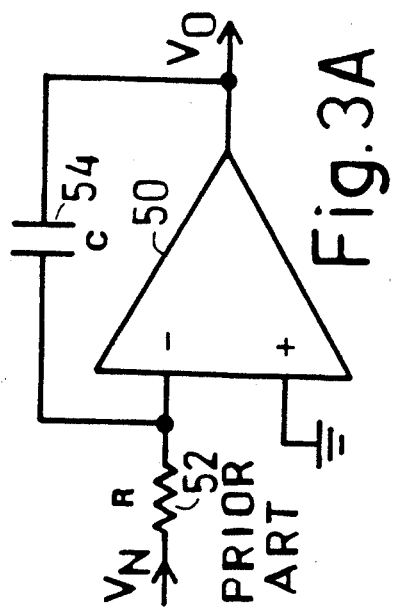
FIG. 3A is a diagram of a prior art inverting integrator using an operational amplifier.

FIG. 3A is a conventional prior art operational amplifier inverting integrator, including an operational amplifier 50 having its non-inverting input grounded, and having an input voltage $V_N$ connected through resistor 52 to the inverting input. The output voltage $V_O$ is fed back through capacitor 54 to the inverting input. It will be obvious to those who are familiar with analog computers that the output voltage is given by $$V_O = \frac{-1}{RC} \int V_N dt.$$

FIG. 3B illustrates an inverting integrator using a fixed gain amplifier 60. An input voltage $V_N$ is applied to the negative input of the differential amplifier, which has a gain G=1. A capacitor 64 of value C is connected between the inverting input and the non-inverting input. A resistor 62 of value R is connected to provide feedback from the output line where the voltage is $V_O$ to the non-inverting input, where a voltage $V_P$ is generated on the non-inverting input line and a current i passes from the inverting input line through the non-inverting input line to the output line. Concerning the operation of the system of FIG. 3B, the following equations may be derived:

$$G(V_P - V_N) = V_O \quad \text{where } G = 1$$
$$V_P - V_N = V_O \quad \text{or} \quad V_P = V_O + V_N$$

$$i = C \frac{d(V_N - V_P)}{dt}$$

$$i = \frac{V_P - V_O}{R}$$

$$V_P - V_O = CR \frac{d(V_N - V_P)}{dt}$$

By substituting $$V_P = V_O + V_N$$

into the previous equation, the following is obtained.

$$V_O + V_N - V_O = CR \frac{d(V_N - V_O - V_N)}{dt}$$

By canceling, rearranging, and integrating $$V_N dt = -CR\ dV_O$$

$$V_O = \frac{-1}{RC} \int V_N dt$$

the output is seen to represent the integral of the input.

Thus the mathematical function carried out by the conventional inverting integrator analog circuit in FIG. 3A is identical to that carried out by the analog circuit according to the present invention as shown in FIG. 3B. No external negative feedback is used to accomplish the result in FIG. 3B.

Figure 4B:
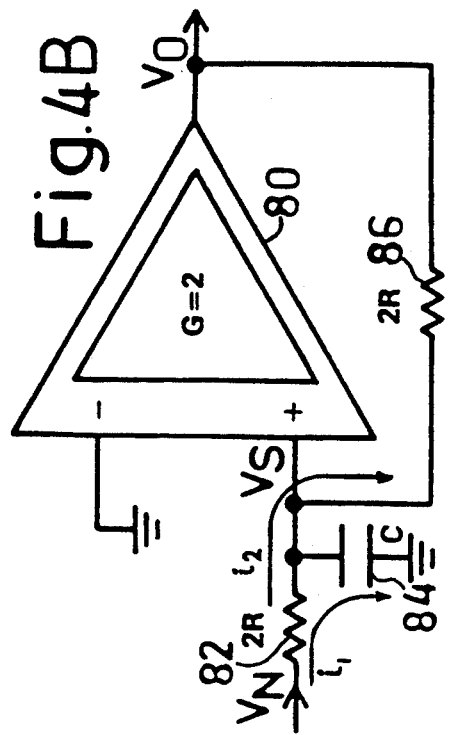
FIG. 4B is a diagram of a non-inverting integrator using a fixed-gain amplifier in accordance with the present invention.
Figure 4A:
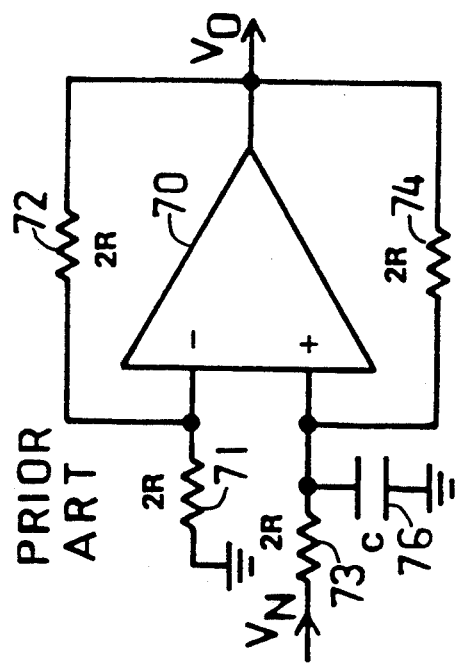
FIG. 4A is a diagram of a prior art non-inverting integrator using an operational amplifier.

FIG. 4A is a diagram of a conventional non-inverting prior art integrator. An operational amplifier 70 has its inverting input connected to ground through a resistor 71 having a value 2R, and its output voltage $V_O$ is connected back to the inverting input through a resistor 72 having a value 2R. The input voltage $V_N$ is applied to the non-inverting input of the amplifier 70 through a resistor 73 having a value of 2R. The output voltage $V_O$ is also applied as feedback through a resistor 74 having a value 2R to the non-inverting input. The non-inverting input is also connected to ground through a capacitor 76 having a value C. The relation of the output voltage to the input is given by $$V_O = \frac{+1}{RC} \int V_N dt$$

FIG. 4B is a diagram of a non-inverting integrator according to the present invention. A fixed-gain amplifier 80 having a gain of 2 has its inverting input grounded. The input voltage $V_N$ is applied through a resistor 82 having a value 2R to the non-inverting input of the amplifier, where a voltage $V_S$ is generated. A capacitor 84 having a value C is connected between back to the non-inverting input through a feedback resistor 86 having a value 2R. A current $i_1$ flows through resistor 82 and capacitor 84 to ground. A second current $i_2$ flows through resistor 82 and resistor 86 to the output.

To understand the embodiment of FIG. 4B, note that $$\frac{V_N - V_S}{2R} = i_1 + i_2$$

$$i_1 = \frac{C dV_S}{dt}$$

$$i_2 = \frac{V_S - V_O}{2R}$$

$$V_S = \frac{V_O}{2}$$

which combine by simple substitution to give the equation $$\frac{V_N}{R} = \frac{C dV_O}{dt}$$

which integrates to yield $$V_O = \frac{+1}{RC} \int V_N dt$$

whereby the mathematical output of the non-inverting integrator according to the present invention is the same as is obtained from the conventional prior art operational amplifier integrator of FIG. 4A. However, with the fixed gain amplifier, there is no external negative feedback used in generating the result.

FIG. 5A is a diagram of a prior art operational amplifier differential integrator. An operational amplifier 90 receives a first input voltage $V_{N1}$ at its inverting input through a resistor 91 having a value R. Negative feedback of the output voltage $V_O$ is provided through capacitor 92 having a value C back to the inverting input. A second input $V_{N2}$ is provided to the non-inverting input of amplifier 90 through a resistor 95 having a value R. The non-inverting input is also connected to ground through a capacitor 96 having a value C. It will be apparent that the output voltage is given by $$V_O = \frac{1}{RC} \int (V_{N2} - V_{N1}) dt$$

FIG. 5B is a diagram of a differential integrator constructed with a fixed-gain amplifier according to the present invention. A fixed-gain amplifier 100 receives a first input voltage $V_{N1}$ at its inverting input through a resistor 101 having a value 2R. The inverting input is connected to ground through a capacitor 102 having a value C and also through a resistor 103 having a value 2R. A second input voltage $V_{N2}$ is applied through a resistor 103 having a value 2R to the non-inverting input of amplifier 100. The non-inverting input is also connected to ground through a capacitor 104 having a value C, and is provided with feedback from output voltage $V_O$ via a resistor 105 having a value 2R. A current $i_1$ passes through resistor 101 and capacitor 102 to ground, and a current $i_2$ passes through resistor 101 and resistor 103 to ground, providing a voltage $V_{S1}$ at the inverting input terminal. A current $i_3$ passes through input resistor 103 and capacitor 104 to ground, and a current $i_4$ passes through resistor 103 and resistor 105 to the output line, providing a voltage $V_{S2}$ at the non-inverting input terminal of the amplifier 100.

Using the equations $$2(V_{S2} - V_{S1}) = V_O$$

$$\frac{V_{N1} - V_{S1}}{2R} = i_1 + i_2$$

$$i_1 = \frac{C dV_{S1}}{dt}$$

$$i_2 = \frac{V_{S1}}{2R}$$

$$\frac{V_{N2} - V_{S2}}{2R} = i_3 + i_4$$

$$i_3 = \frac{C dV_{S2}}{dt} \text{ and}$$

$$\frac{V_{S2} - V_O}{2R} = i_4$$

These equations can be reduced to $$\frac{1}{RC}(V_{N2} - V_{N1}) = \frac{dV_O}{dt}$$

which integrates to $$V_O = \frac{1}{Rc} \int (V_{N2} - V_{N1}) dt$$

which is the same mathematical result provided by the conventional differential integrator using an operational amplifier, but without any external negative feedback. FIG. 6A illustrates a conventional operational amplifier inverting differentiator. This circuit is marginally unstable, as are all differentiators, but those made with operational amplifiers are more so, because the 90 degrees of phase shift in an operational amplifier and 90 degrees of phase shift in the feedback network tend to combine to create an oscillator under some circumstances. An operational amplifier 110 is used in this circuit, and has its input $V_N$ connected to its inverting input through a capacitor 102 having a value C. The output voltage $V_O$ is fed back to the inverting input through a resistor 104 having a value R. The non-inverting input is grounded. It is obvious to those familiar with analog computers that the output is given by $$V_O = \frac{-RC dV_N}{dt}.$$

FIG. 6B is a diagram of an inverting differentiator according to the present invention. A fixed-gain amplifier 120 receives an input voltage $V_N$ at its inverting input. The inverting input is connected to the non-inverting input by a resistor 122 having a value R. The non-inverting input is connected to the output terminal to feedback the output voltage $V_O$ via a capacitor 124 having a value C. This generates a voltage $V_P$ at the non-inverting input. The operation of the circuit is shown by the following equations:

$$G(V_P - V_N) = V_O \quad \text{where } G = 1$$
$$\text{or } V_P = V_O + V_N$$

$$i = C \frac{d(V_P - V_O)}{dt}$$

$$i = \frac{V_N - V_P}{R}$$

$$V_N - V_P = CR \frac{d(V_P - V_O)}{dt}$$

and by combination it is seen that $$V_O = \frac{-RC dV_N}{dt}.$$

Thus the inverting differentiator according to the invention achieves the same mathematical result as the inverting differentiator according to the prior art, but without the use of any external negative feedback.

At a time when most amplifiers which are commonly used are in the form of integrated circuits (ICs), an IC FGA does not exist. The closest device that could be found is a TL592 (equivalent to an NE592 and similar to a UA733). This is a rather old device, which has a true differential input, but the output range does not include ground, so only alternating current coupled circuits could be used. I do not believe it would be difficult to design an IC FGA, and it would insure greater gain stability to have the entire amplifier on one monolithic chip, all parts of which maintain the same temperature. Nevertheless, I have designed a discrete element FGA and include a diagram for it in FIG. 7 in order to insure a complete disclosure.

Figure 7:
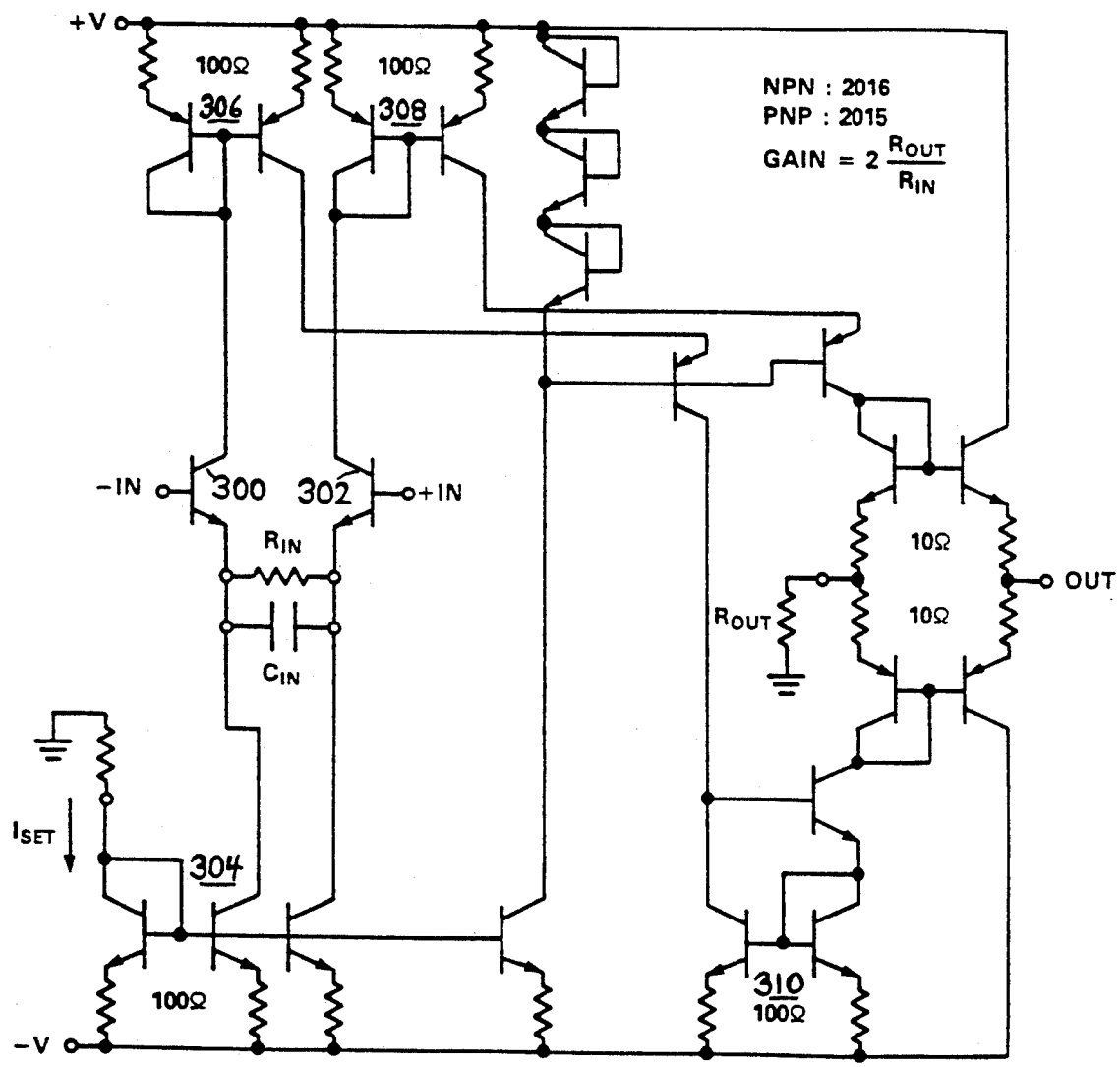
FIG. 7 is a circuit diagram of a fixed-gain amplifier which is useable in the various embodiments of present invention.

In the circuit of FIG. 7, all NPN transistors are type 2016 and all PNP transistors are type 2015. The overall gain of the amplifier of FIG. 7 is two times the value of $R_{OUT}$ divided by the value of $R_{IN}$.

The input to the circuit is through a matched differential pair of transistors 300, 302, set by a current source pair 304 reflecting an externally set current $I_{SET}$. The collector currents of the input pair go to a pair of current mirrors, 306, 308, reflecting them from the positive supply. One of these currents is reflected again at 310 from the negative supply, and the two are summed to give a single-ended current out which is dumped into a load (output) resistor $R_{OUT}$. Since the two dc currents summed are of opposite polarity, they cancel, giving zero volts. This voltage is buffered by a complimentary emitter-follower to give a low impedance out. Diode-connected transistors cancel out the base emitter drops to minimize crossover distortion.

An input resistor $R_{IN}$ is connected between the emitters of the input transistors so that any differential input voltage across them creates a differential (unbalance) current which is reflected through and becomes a non-zero current in the load resistor, causing a proportional output voltage. As shown by the equation, the voltage gain is given by the ratio of the two resistors times two, the doubling caused by the differential-to-single-ended conversion.

The last-mentioned current mirrors must be a Wilson circuit for best matching of its input and output currents; the previous two sets occur in balanced pairs so accuracy is less important. The pair of PNP transistors in the middle of the circuit connected to a bias voltage is necessary so that the two current mirrors connected to the positive rail see the same voltage (cascode connection), minimizing the effect of finite transistor output impedance (equivalent to finite Early Voltage). Without them offset is considerably worse. The capacitor $C_{IN}$ across the input resistor improves the high frequency response of the circuit. It compensates for capacitance across the output resistor. It is adjusted for flat step response, similar to adjusting a scope probe. It thus must be selected according to the gain used. Note that if the power supplies are interchanged and NPNs and PNPs interchanged, a complimentary circuit is obtained.

The circuit would certainly be better in monolithic form. In monolithic form, the emitter ballast resistors would be unnecessary. The breadboard circuit will work without them using monolithic quad transistors and no resistors, but offset is much worse. Three hundred and fifty MHz transistors are used; much faster ones are now available.

Note that if the input resistor were shorted and compensation added, the circuit would become an operational amplifier. The difference between the two is basically that in an operational amplifier, all the gain is put together and negative feedback is used around the entire amplifier to stabilize the gain, while in a FGA, the negative feedback is instead used within each stage, greatly easing the oscillation problem and eliminating the need for compensation.

Because fixed-gain integrated circuit amplifiers are not now available, even though integrated circuit amplifiers have a significantly faster response time than amplifiers assembled out of components, comparative tests of integrated-circuit fixed-gain amplifiers with operational amplifier circuits are not yet possible. However, I have run comparative tests using the amplifier of FIG. 7 both as an operational amplifier and as a fixed gain amplifier. I connected them in their simplest mode, as a unit gain amplifier. When the amplifier of FIG. 7 was set up as an operational amplifier, I fed in a test signal to the non-inverting input with no input resistor, and I connected the output back, through no resistor, to the inverting input of the amplifier. When the amplifier of FIG. 7 was set up as a fixed gain amplifier, I grounded the inverting input and fed the test signal directly to the non-inverting input. I found that the rise time of the circuit in its fixed gain configuration was four times faster than the rise time of the circuit in its operational amplifier configuration. While this is a substantial and worthwhile improvement, I suspect that the difference will be substantially greater when the fixed-gain amplifier is available in an integrated circuit version.

What I claim is:

1. In an electronic analog computer comprising input and output lines for respectively receiving at least one input signal and outputting at least one output signal and further comprising an amplifier having an inverting input terminal, a non-inverting input terminal and an output terminal, at least one input terminal and the output terminal each being operatively connected respectively to at least one of the input and output lines, and further comprising at least one impedance connecting at least one of said signals between at least one of said lines and one of said terminals, whereby a mathematical function of at least one of input signals is generated by the analog computer and presented as the output signal on the output line, the improvement comprising a fixed-gain differential amplifier having a fixed gain, said amplifier being used as the amplifier in the computer, the fixed gain of the amplifier in the absence of external feedback having an absolute value no greater than six, and the impedance connecting the output terminal with the inverting input terminal, other than impedance used in the construction of the fixed-gain differential amplifier itself, having a value which is so large that it is functionally equivalent to an infinite value, whereby there is no negative feedback external to the amplifier used in the computer.

2. The electronic analog computer of claim 1 wherein at least one said output signal has an amplitude proportional to an internal function of the amplitude of at least one said input signal.

3. The electronic analog computer of claim 2 further comprising a capacitor connected between the inverting and non-inverting inputs of the fixed-gain amplifier, and a resistor connected between the output and the non-inverting input of the fixed gain amplifier, whereby the fixed gain of the amplifier is such that when an input signal is applied to the inverting input terminal, an output signal is provided which is proportional in amplitude to an inverted integral of the input signal.

4. The electronic analog computer of claim 2 further comprising a first resistor having a first resistor value connecting an input signal to the non-inverting input of the fixed gain amplifier, a capacitor connecting the non-inverting input to ground, a second resistor having a second resistor value connecting the output terminal to the non-inverting input of the fixed gain amplifier, and a connection between the inverting input terminal and ground, whereby the fixed gain of the amplifier and a ratio of the value of the two resistor is such that when an input voltage is applied to the first resistor, an output signal from the computer is obtained which is proportional to the non-inverted integral of the input signal.

5. The electronic analog computer of claim 2 further comprising
   a first resistor having a first resistance value connecting a first input signal to the inverting input terminal of the amplifier,
   a first capacitor having a first capacitor value connecting the inverting input terminal of the amplifier to ground,
   a second resistor having a second resistance value connecting the inverting input terminal of the amplifier to ground,
   a third resistor having a third resistance value connecting a second input signal to the non-inverting input terminal of the amplifier,
   a second capacitor having a second capacitor value connecting the non-inverting input terminal of the amplifier to ground, and
   a fourth resistor having a fourth resistance value connecting the output terminal of the amplifier to the non-inverting input terminal of the amplifier,
   whereby the value of the gain of the amplifier and the values of the resistors and capacitors are chosen such that the output signal from the amplifier is proportional in amplitude to the integral of the difference between the values of the first and second input signals.

6. An electronic analog computer according to claim 1, wherein at least one said output signal has an amplitude proportional to a differential function of the amplitude of at least one said input signal.

7. An electronic analog computer according to claim 6, further comprising
   a resistor connected between the non-inverting and the inverting terminals of the fixed-gain amplifier, and
   a capacitor connected between the output terminal and the non-inverting input terminal of the amplifier,
   whereby the fixed gain is chosen such that an output signal from the computer is proportional to the derivative with respect to time of at least one of the input signals.

8. An electronic analog computer according to claim 1, wherein the computer provides an output signal which is proportional in amplitude to a sum of its input signals.

9. An electronic analog computer comprising
   a fixed-gain differential amplifier having an inverting input terminal, a non-inverting input terminal, and an output terminal, and having a fixed gain no greater in absolute value than six in the absence of negative feedback from the output terminal to the inverting input terminal,
   means for supplying at least one input signal to an input line of the computer, in order that an output signal from the output terminal can be made to simulate the results of applying a mathematical function to the input signal, and
   an impedance connecting the at least one input signal to at least one of the two said input terminals to cause the computer to simulate that mathematical function.

* * * * *